(12) United States Patent
Hwu et al.

(10) Patent No.: US 9,812,395 B2
(45) Date of Patent: Nov. 7, 2017

(54) METHODS OF FORMING AN INTERCONNECT STRUCTURE USING A SELF-ENDING ANODIC OXIDATION

(71) Applicants: Taiwan Semiconductor Manufacturing Company Limited, Hsinchu (TW); National Taiwan University, Taipei (TW)

(72) Inventors: Jenn-Gwo Hwu, Taipei (TW); Wei-Cheng Tian, Taipei (TW); Samuel C. Pan, Hsinchu (TW); Chao-Hsiung Wang, Hsin-Chu (TW); Chi-Wen Liu, Hsinchu (TW)

(73) Assignee: Taiwan Semiconductor Manufacturing Company Limited & National Taiwan University (TW)

( * ) Notice: Subject to any disclaimer, the term of this patent is extended or adjusted under 35 U.S.C. 154(b) by 0 days.

(21) Appl. No.: 14/507,918

(22) Filed: Oct. 7, 2014

(65) Prior Publication Data
US 2016/0099172 A1    Apr. 7, 2016

(51) Int. Cl.
*H01L 23/528* (2006.01)
*H01L 21/768* (2006.01)
*H01L 23/522* (2006.01)

(52) U.S. Cl.
CPC ........ *H01L 23/528* (2013.01); *H01L 21/7682* (2013.01); *H01L 21/76801* (2013.01); *H01L 21/76885* (2013.01); *H01L 21/76888* (2013.01); *H01L 23/522* (2013.01); *H01L 23/5283* (2013.01); *H01L 2221/1094* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 3,531,857 A | * | 10/1970 | Iwamatsu | H01L 21/76297 148/DIG. 114 |
| 4,469,527 A | * | 9/1984 | Sugano et al. | 438/166 |
| 5,463,483 A | * | 10/1995 | Yamazaki | 349/41 |
| 6,464,853 B1 | * | 10/2002 | Iwasaki et al. | C25D 11/04 205/118 |
| 7,482,228 B1 | * | 1/2009 | Padmanabhan et al. | 438/259 |

(Continued)

OTHER PUBLICATIONS

Akiyama et al., "Ion-Sensitive Field-Effect Transistors with Inorganic Gate Oxide for pH Sensing," 1982, IEEE Transactions on Electron Devices, 29(12), pp. 1936-1941.*

(Continued)

*Primary Examiner* — Kimberly Rizkallah
*Assistant Examiner* — Bo Bin Jang
(74) *Attorney, Agent, or Firm* — Jones Day

(57) ABSTRACT

A method of forming low-k interconnect structure is disclosed, which comprises: providing at least one protruding structure on a substrate traversing between a first connection region to a second connection region defined thereon; performing anodic oxidation on the substrate having the protruding structure; forming one or more nanowire interconnect in the protruding structure traversing between the first connection region and the second connection region; the nanowire interconnect being surrounded by a dielectric layer formed during the anodic oxidation.

25 Claims, 13 Drawing Sheets

(56) References Cited

U.S. PATENT DOCUMENTS

2007/0105321 A1* 5/2007 Lee ................... B82Y 10/00
                                              438/270
2008/0135949 A1* 6/2008 Lo et al. ................... 257/401

OTHER PUBLICATIONS

Ho et al., "Selective Anodic Oxidation of Silicon in Oxygen Plasma," 1980, IEEE Transactions on Electron Devices, 27(8), pp. 1436-1443.*

* cited by examiner

100

- 110 — Providing at least one protruding structure on a substrate traversing between a first connection region to a second connection region defined thereon;

- 120 — providing a mask layer on a surface of an upper portion of the protruding structure, the mask layer reducing an exposure of the upper portion in the anodic oxidation process, thereby reducing an oxidizing rate to the upper portion of the protruding structure.

- 130 — performing anodic oxidation on the substrate having the protruding structure;

- 140 — forming one or more nanowire interconnect in the protruding structure traversing between the first connection region and the second connection region, the nanowire interconnect being surrounded by a dielectric material formed during the anodic oxidation

FIG. 1

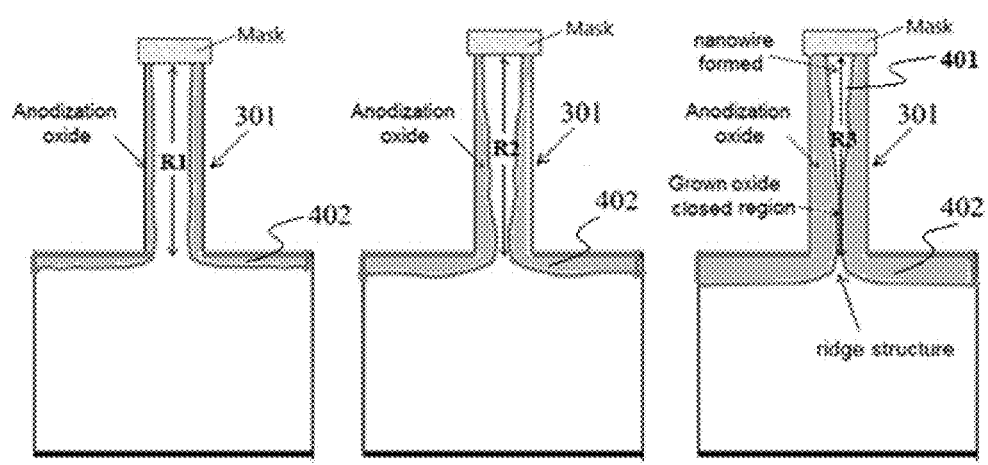
FIG. 5A  FIG. 5B  FIG. 5C
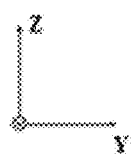

METHODS OF FORMING AN INTERCONNECT STRUCTURE USING A SELF-ENDING ANODIC OXIDATION

TECHNICAL FIELD

The present invention relates generally to fabrication of interconnect structures, and, more particularly, to a self-insulated low-k interconnect structure and fabrication methods thereof.

BACKGROUND

The dielectric constant of a porous structure may be significantly lower than a conventional dielectric material. Replacing the conventional silicon dioxide with a low-K dielectric material of the same thickness reduces parasitic capacitance noticeably, thus enabling faster switching speeds and better heat dissipation.

Accordingly, a low-k interconnect structure and a fabrication method thereof is proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method of forming an interconnect structure in accordance with embodiments of the instant disclosure.

FIGS. 5A-C are illustrative diagrams showing a cross-sectional profile of a structure during various stages of anodic oxidation process in accordance with embodiments of the instant disclosure.

DETAILED DESCRIPTION

Figure 2A:
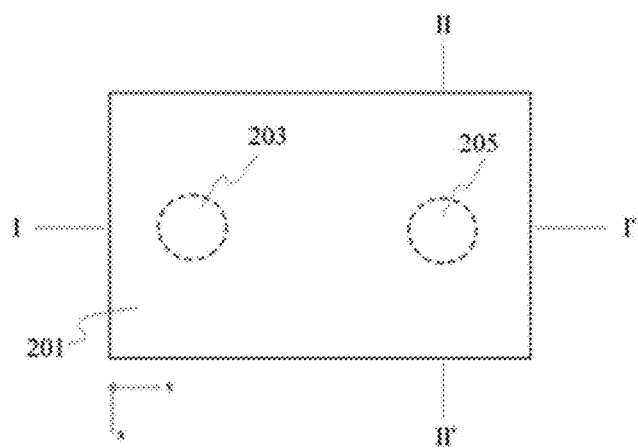
FIG. 2A shows an overhead view of an interconnect structure at one stage of fabrication in accordance with embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the ease and accuracy of orientation referral, an x-y-z coordinate reference is provided, in which the x-axis is generally orientated along a substrate surface in a first direction, the y-axis is generally oriented along the substrate surface perpendicular to the x-axis, while the z-axis is oriented generally along the vertical direction with respect to the planar surface of a substrate (which, in most cases, defined by the x-y plane).

During the back-end of the line (BEOL) portion of the complementary metal-oxide semiconductor (CMOS) processing, insulating dielectrics are used to provide electrical isolation between individual components (e.g., transistors) and/or metal lines. Following the down-scaling prediction of the Moore's law, the dimension of the insulating dielectrics between metal interconnects and different metal layers keeps on shrinking. The decrease in the dimension of the dielectrics resulted in some undesirable effects to degrade the device performance. Replacing the common silicon dioxide with a low-K dielectric material of the same thickness reduces parasitic capacitance, thereby enabling faster switching speeds and better heat dissipation.

Air has a very low dielectric constant (of about 1.00000), and voids in a structure can provide an equivalent dielectric constant of as low as about 1.00059. Thus, the dielectric constant of a porous structure may be significantly lower than a conventional dielectric material, and the dielectric constant of a porous structure may be further reduced by increasing the porosity thereof. Various methods were utilized to create voids or nano-pores in a silicon dioxide dielectric.

However, typical steps in the BEOL process, such as repetition of dielectric deposition, lithography, metal deposition, CMP, and the like, often pose harsh conditions to the on-chip components and features. As a result, the porous dielectrics often have difficulties surviving the harsh conditions during the BEOL processes due to its low mechanical strength.

Referring to FIG. 1. FIG. 1 is a flow chart illustrating a method of forming an interconnect structure in accordance with embodiments of the instant disclosure. Certain features of the disclosure will be discussed in detail in further Figures, but are referenced here for the reader's clarity after having read the entire disclosure. Specifically, the flow chart of FIG. 1 shows a method 100 of forming an interconnect structure (such as the structure shown in FIG. 4A). The method 100 begins with process 110, in which at least one protruding structure (such as the protruding structure 301 shown in FIG. 3A) is provided on a substrate. The protruding structure traverses between a first connection region and a second connection region (such as regions 203 and 205 shown in FIG. 2A) defined on the substrate. The method 100 may proceed with process 130, in which one or more anodic oxidation process (a self-ending process) is performed on the substrate having the protruding. The method 100 may then proceeds to process 140, in which the anodic oxidation process causes oxidation from the exposed surface of the protruding structure and the substrate, thus forming one or more nanowire interconnect in the protruding structure (such as the nanowire interconnect 401 shown in FIG. 4A) before the self-ending anodic oxidation process terminates. The resultant nanowire interconnect is surrounded by a dielectric material (such as dielectric layer 402 shown in FIG. 4C) formed during the anodic oxidation process.

Moreover, to prevent over-oxidation of the protruding structure and ensure the formation of the nanowire interconnect, a process 120 may be implemented to provide a mask layer (such as the mask shown in FIG. 5A) on a top surface (i.e., the tip/upward facing surface of the protruding structure 301) of the protruding structure to reduce an oxidizing rate at an upper portion thereof.

Figure 2B:
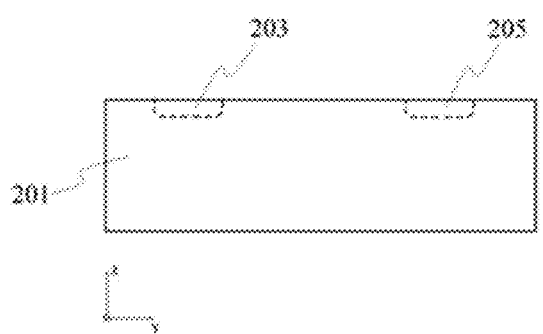
FIG. 2B shows a cross-sectional view of the structure shown in FIG. 2A along the line I-I'.
Figure 2C:
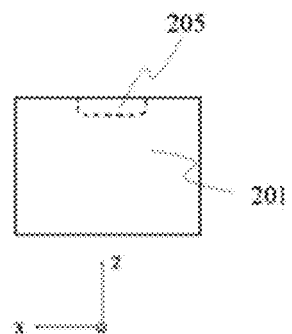
FIG. 2C shows a cross-sectional view of the structure shown in FIG. 2A along the line II-II'.

Referring concurrently to FIGS. 2A, 2B, 2C, and process 110 of FIG. 1. FIG. 2A shows an overhead view of an interconnect structure at one stage of fabrication in accordance with embodiments of the instant disclosure. FIG. 2B shows a cross-sectional view of the structure shown in FIG. 2A along the line I-I'. FIG. 2C shows a cross-sectional view of the structure shown in FIG. 2A along the line II-II'. Specifically, FIGS. 2A-C show a substrate 201 having a first connection region 203 and a second connection region 205 defined on a surface thereof.

As modern integrated circuits routinely embodies massive numbers of minute active/passive components/features on a substrate, the integration of these components and features often requires interconnect structures of great quantity and routing complexity to establish electrical connections therebetween for creating functioning circuits. The interconnect structures may include not only horizontal (i.e., planar) pattern arrangements but also vertical routing configurations, thereby enabling signal communications between components arranged on the same level of a chip as well as those disposed vertically across different levels thereof. However, for simplicity of illustration, the instant embodiment uses two substantially coplanarly arranged connection regions 203, 205 as example. The first and the second connection regions 203, 205 include regions of different locations on the substrate 201, and may respectively comprise a portion of an active component (e.g., a source/drain node of a transistor) or a passive feature (e.g. ground/VSS) that are designed to be electrically interconnected to constitute a portion of a functioning circuit.

The substrate 201 may comprise a crystalline silicon substrate (e.g., wafer). The substrate may comprise various doped regions depending on design requirements (e.g., p-type substrate or n-type substrate). The doped regions may be doped with p-type dopant, such as boron or $BF_2$; n-type dopant, such as phosphorus or arsenic; and/or combinations thereof. In some alternative embodiments, the substrate 201 may be made of some other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Figure 3A:
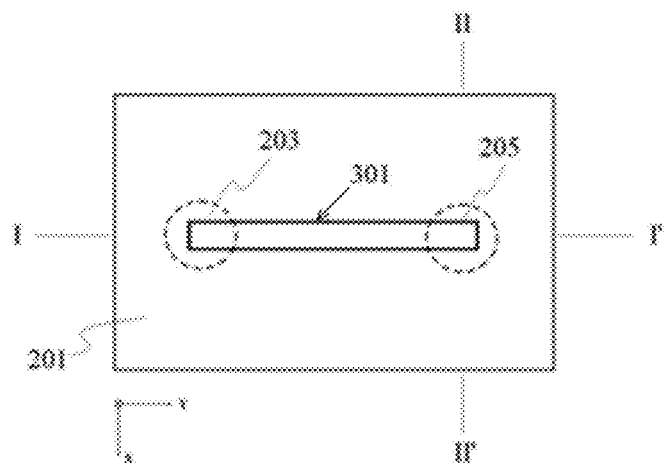
FIG. 3A shows an overhead view of an interconnect structure at one stage of fabrication in accordance with embodiments of the instant disclosure.
Figure 3B:
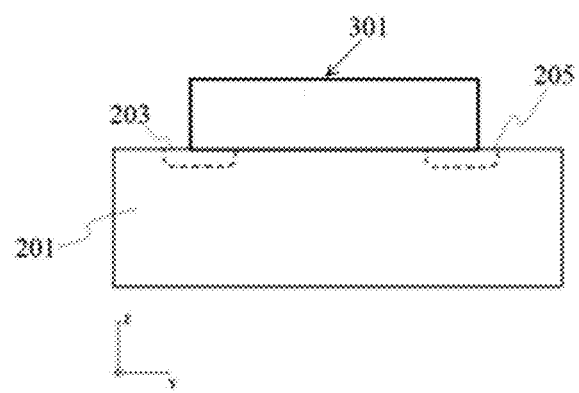
FIG. 3B shows a cross-sectional view of the structure shown in FIG. 3A along the line I-I'.
Figure 3C:
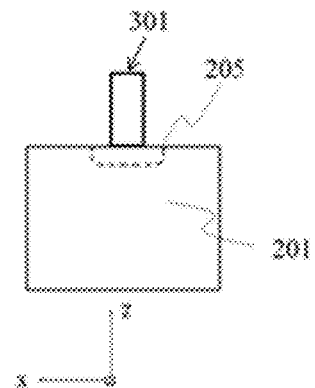
FIG. 3C shows a cross-sectional view of the structure shown in FIG. 3A along the line II-II'.

Referring concurrently to FIGS. 3A, 3B, 3C, and process 130 of FIG. 1. FIG. 3A shows an overhead view of an interconnect structure at one stage of fabrication in accordance with embodiments of the instant disclosure. FIG. 3B shows a cross-sectional view of the structure shown in FIG. 3A along the line I-I'. FIG. 3C shows a cross-sectional view of the structure shown in FIG. 3A along the line II-II'. Specifically, a protruding structure 301 is provided on a surface of the substrate 201. The protruding structure 301 is patterned is such a way that traverses between the first and the second connection regions 203, 205. Particularly, the protruding structure 301 of the instant embodiment comprises a generally slim and elongated structure defined substantially by a general width along the x-axis, a general height along the z-axis, and a general length along the y-axis. The exemplary protruding structure 301 comprises a high aspect ratio along the x-axis (i.e., a high ratio between the height (z-direction) and the width (x-direction)), and traverses continuously in a straight-line fashion between the first connection region 203 and the second connection region 205.

To achieve higher pattern density, the protruding structure 201 may be a nano-scaled structure. In addition, the shapes, forms and aspect ratios of the protruding structure may be adjusted to provide interconnect structures of different types (e.g., vertical type and horizontal type), thus enabling adaptable interconnect configurations for connecting different types of components and/or features on a chip (more details will be discussed in a later section). In some embodiments, the protruding structure may comprise a non-straight-line projected pattern on the x-y plane. In some embodiments, more than one protruding structures may be utilized either continuously or in cooperation with other components/features to jointly create a connecting path between two or more connection regions.

The protruding structure 301 may be made of materials capable of conducting electricity, which includes metallic materials, elemental semiconductors, compound semiconductor materials, and a suitable combination thereof. Moreover, the protruding structure 301 may be of the same material of the substrate 201. For instance, the protruding structure may be formed by a top-down method, such as wet/dry etching using suitable masking/etchant combination to reduce selective regions on a surface of a bulk substrate down to a predetermined depth. This negatively defines a vertically standing protruding structure out of a masked remaining portion of the substrate, which protrudes from the recessed trench surfaces resulting from the etching process. In some embodiments, the etching process includes repeated isotropic etching cycles, an anisotropic etching, or a combined isotropic/passivation cycles. Other suitable methods for patterning the protruding structure 301 may include e-beam lithography, extreme ultraviolet lithography, resist trimming, nanoelectrode lithography, charged-ion-beam (CIB) process, or a suitable combination thereof.

Accordingly, a mask of a suitable pattern (as illustrated in FIG. 5A) may remain on a top portion (e.g., an upward-facing surface) of the protruding structure 301, which may be conveniently utilized to control an oxidation rate of the top portion of the protruding structure 301 in a subsequent anodic oxidation process (referring to process 120 of FIG. 1, and will be discussed in more detail in a later section). Alternatively, a bottom-up method may be used, such as an epitaxial deposition of suitable materials on a substrate surface to positively define a vertically erecting protruding structure.

Figure 4A:
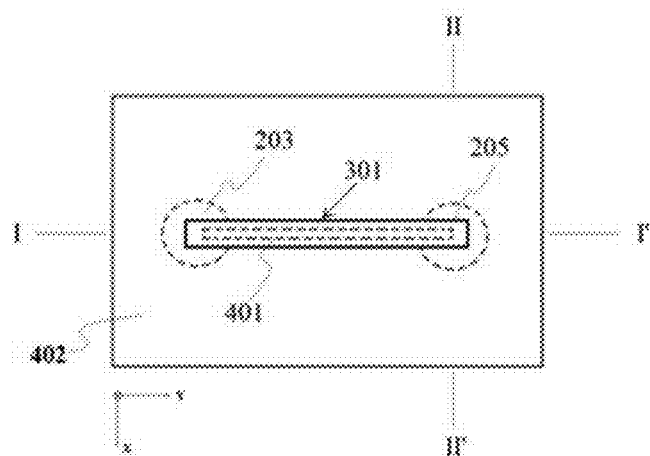
FIG. 4A shows an overhead view of an interconnect structure at one stage of fabrication in accordance with embodiments of the instant disclosure.
Figure 4B:
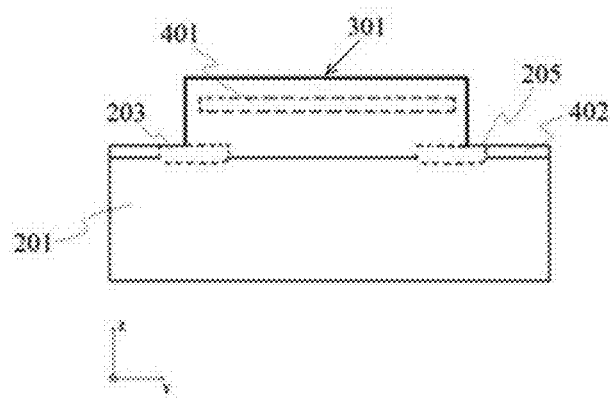
FIG. 4B shows a cross-sectional view of the structure shown in FIG. 4A along the line I-I'.
Figure 4C:
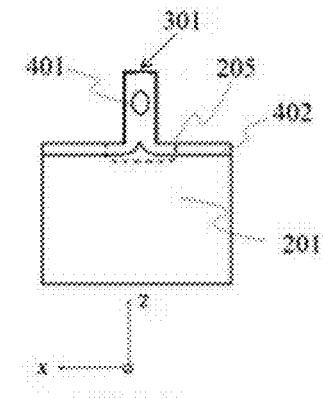
FIG. 4C shows a cross-sectional view of the structure shown in FIG. 4A along the line II-II'.

Referring concurrently to FIGS. 4A, 4B, 4C, and process 130 of FIG. 1. FIG. 4A shows an overhead view of an interconnect structure at one stage of fabrication in accordance with embodiments of the instant disclosure. FIG. 4B shows a cross-sectional view of the structure shown in FIG. 4A along the line I-I'. FIG. 4C shows a cross-sectional view of the structure shown in FIG. 4A along the line II-IF. The substrate 201 having the protruding structure 301 is subjected to an anodic oxidation process. The anodic oxidation process of the substrate 201 and the protruding structure 301 may be performed by utilizing the process and device disclosed in the co-pending U.S. patent application Ser. No. 14/315,421, titled "SYSTEM AND METHODS FOR FORMING NANOWIRES USING ANODIC OXIDATION," whose content is incorporated herein by reference in its entirety. For instance, the substrate 201 may be immersed in an electrolytic solution and used as part of an anode electrode during the electrochemical oxidation process. One or more cycles of anodic oxidation process may be performed to obtain a desired structural profile.

The anodic oxidation process causes the formation of oxide materials (e.g., a dielectric layer 402) from the exposed surfaces of the protruding structure 301 and the substrate 201. The anodic oxidation is generally a self-ending process, where the generation of oxide material ultimately reaches a termination point without external interference. Particularly, the oxide material(s) produced during the oxidation process possesses higher electrical resistance than the original conductive materials of the protruding structure 301. As oxide material(s) grows and the thickness of the dielectric layer 402 increases, the internal equivalent resistance of the protruding structure 301 also increases, thus reducing a magnitude of a corresponding electric field there-through (i.e., the driving source of the anodic oxidation). As the growth of oxide material(s) reaches a certain point, the equivalent electrical resistance becomes large enough to substantially nullify the corresponding electric field through the protruding structure 301, thereby bringing the oxidation process to a stop. In some occasions, the self-ending oxidation process terminates when the entire content(s) of the protruding structure 301 is converted into oxide material(s).

However, by properly configuring a transverse cross-sectional profile of the protruding structure, an original conductive material thereof may be preserved within the oxidized structure (which is adjusted to form suitable profiles that serve as interconnects). For instance, a transverse cross-sectional profile may be arranged so that a lower portion of the protruding structure in connection with the substrate substantially completely oxidizes before an upper portion thereof, thereby facilitating the generation of an elongated conductive structure embedded in an upper portion of the protruding structure before the termination of the self-ending oxidation process.

Figures 10A, 10B:
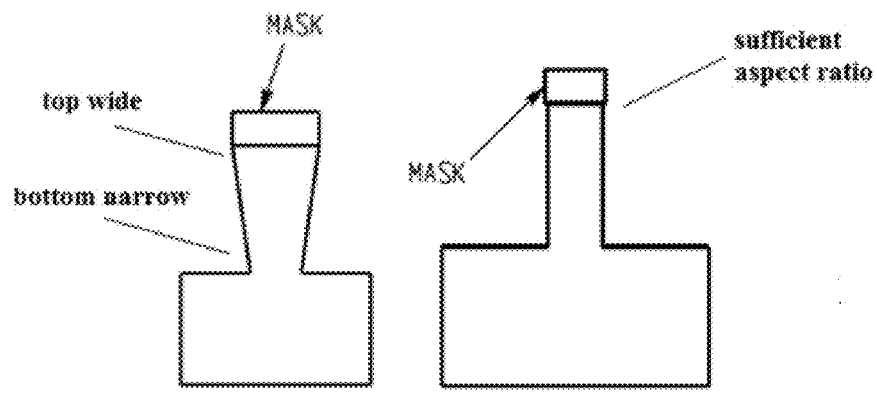
FIGS. 10A-D illustrate various cross-sectional profile configurations in accordance with embodiments of the instant disclosure.
Figures 10C, 10D:
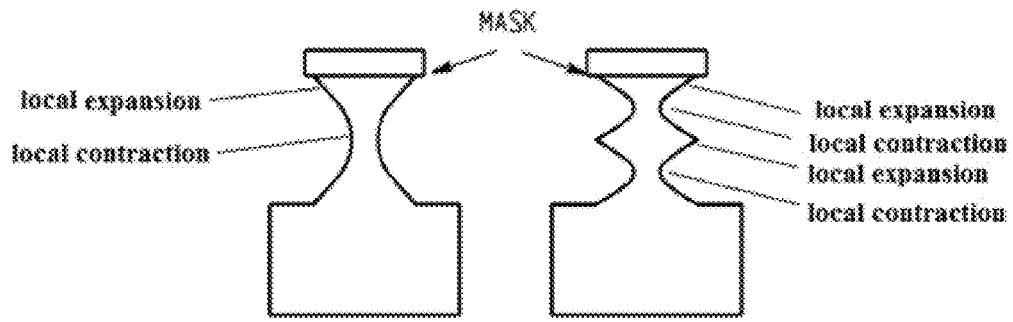

Referring cooperatively to FIGS. 10A-D, which illustrate various cross-sectional profile configurations in accordance with embodiments of the instant disclosure. In some embodiments, a top-wide, bottom narrow profile (as shown in FIG. 10A) is used to facilitate a faster completion of oxidation at the bottom portion of the protruding structure. In addition, a mask of a suitable material (which includes photoresist, oxides, nitrides, or the like) may be provided on a top portion (e.g., an upward-facing surface) of the protruding structure to reduce an oxidation rate of the top portion thereof. In some embodiments, a cross-sectional profile having a sufficiently high aspect ratio (i.e., height to width ratio) may provide similar results (as shown in FIG. 10B). In some cases, the threshold value of the aspect ratio is 1. In some embodiments, the transverse cross-sectional profile of the protruding structure comprises at least one pair of local expansion and local contraction profiles (such as shown in FIGS. 10C and 10D), where the local contraction profile is arranged closer to the substrate than the local expansion profile. One or more Bosch process may be utilized to form such scalloped undercut profiles. Such a profile may facilitate the generation of more than one (substantially vertically aligned) conductive structure in the protruding structure (such as upper and lower nanowires shown in FIG. 6D).

Referring concurrently to FIGS. 4A, 4B, 4C, and process 140 of FIG. 1. In the instant embodiment, the un-oxidized material embedded within the surrounding dielectric layer 402 is configured into a nanowire interconnect 401 extending between the first connection region 203 and the second connection region 205. Moreover, the resultant nanowire interconnect 401 is surrounded by a dielectric layer 402 formed during the anodic oxidation process.

FIGS. 5A, 5B, and 5C are illustrative diagrams showing a cross-sectional profile of a structure during various stages of anodic oxidation process in accordance with embodiments of the instant disclosure. Particularly, FIGS. 5A-C cooperatively provide a more intuitive illustration of oxide formation during the self-ending anodic oxidation process, in according with some embodiments of the instant disclosure. Specifically, a mask is disposed on a top part of the protruding structure to protect the top portion from over-oxidization.

As shown in FIG. 5A, at the beginning of the anodic oxidation process, positive charges (not shown) distributes approximately uniformly across the protruding structure. An oxide layer (e.g., the dielectric layer 402) is formed approximately uniformly from top to bottom of a protruding structure (e.g., the protruding structure 301). An electric field associated with a top part of the protruding structure is approximately equal to an electric field associated with a bottom part of the protruding structure in magnitude. The protruding structure poses an associated equivalent resistance $R_1$, which is generally low at an initial stage.

As shown in FIG. 5B, further into the anodic oxidation process, the charge distribution changes as the oxide grows. With proper cross-sectional profile configuration and the use of mask on the top, the oxide (e.g., the dielectric layer 402) grows more at the bottom part than at the top part. An equivalent resistance $R_2$ associated with the protruding structure at this stage becomes larger than the previous resistance $R_1$. An electric field associated with the top part becomes smaller in magnitude, while an electric field associated with the bottom part remains approximately at a same magnitude.

As shown in FIG. 5C, at the end of the anodic oxidation process, the oxide (e.g., dielectric layer 402) further grows at the bottom part of the protruding structure until a conduction channel of charges to the top part of the protruding structure is closed off. An electric field associated with the top part decreases to a small magnitude (e.g., zero), and an electric field associated with the bottom part also becomes approximately zero. Once the conduction channel of charges to the top part is sealed off, the oxide stops growing at the top part of the protruding structure. The un-oxidized material (e.g., the original conductive material of the protruding structure) at the top part of the protruding structure therefore forms a nanowire (e.g., nanowire interconnect 401) that extends substantially along the x-axis direction.

Moreover, the oxide generation at the bottom portion (e.g., the self-closing of conduction path) may yield a ridge structure that extends substantially along the extension direction of the protruding structure (which is also along the extension path of the embedded nanowire).

Referring to FIGS. 6A-6D. FIGS. 6A-D show cross-sectional profiles of structures having various aspect ratio configurations in accordance with embodiments of the instant disclosure. Particularly, FIGS. 6A to 6D depict example diagrams showing anodic oxidation performed on protruding structures of different aspect ratio configurations, and the resultant structures obtained upon the determination of the self-ending process. Specifically, between each pair of outward pointing arrows indicate a protruding structure having a particular width (W). A height of each of the protruding structure is configured to be substantially identical, so that the aspect ratio thereof depends primarily on the corresponding structural width (W). As shown in FIGS. 6A-6D, under approximately same conditions for anodic oxidation (e.g., duration of oxidation), nanowires are formed for the protruding structures with a structural width of 60 nm (e.g., FIG. 6D), while for the wider setups (i.e., lower aspect ratios, such as the protruding structures with widths of 70 nm, 80 nm, and 90 nm widths), oxides did not grow farther enough at the bottom portions thereof to enclose parts of the original conductive material to form nanowires (e.g., FIGS. 6A-6C).

Figure 6A:
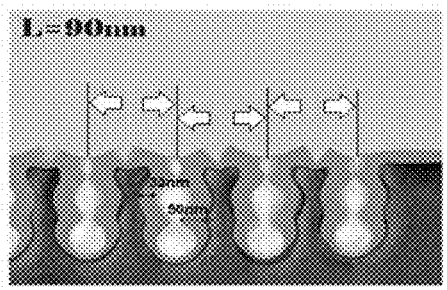
FIGS. 6A-D show cross-sectional profiles of structures having various aspect ratio configurations in accordance with embodiments of the instant disclosure.
Figure 6B:
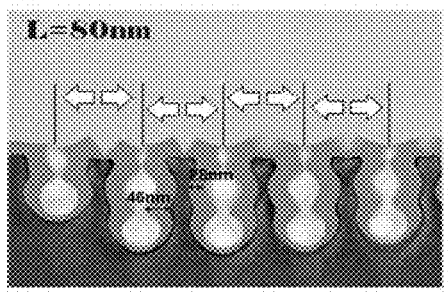
Figure 6C:
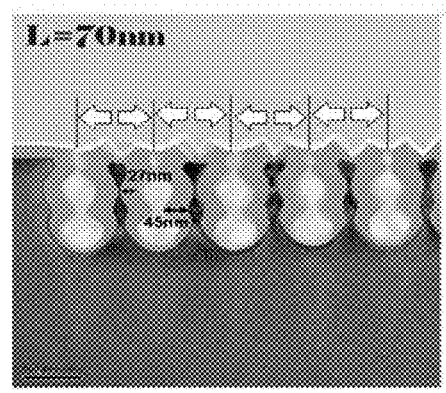
Figure 6D:
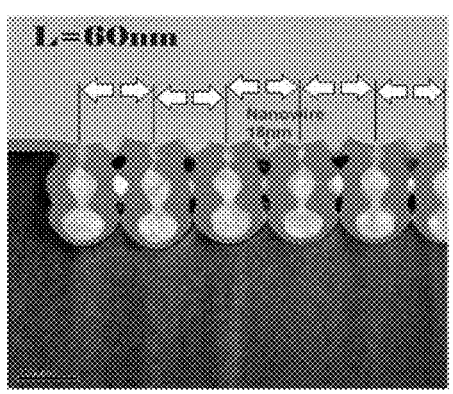

This indicates that under certain conditions for anodic oxidation (e.g., duration of oxidation and/or corresponding cross-sectional profile configuration), horizontally extending nanowires that are electrically isolated from the substrate can be formed in a protruding structure with an aspect ratio greater than an aspect ratio threshold value (as shown in FIG. 6D). Likewise, under certain conditions for anodic oxidation, vertically extending nanowires that are shorted to the substrate (i.e., in electrical connection thereto) can be formed in a protruding structure with an aspect ratio less than an aspect ratio threshold value (as shown in FIGS. 6A-C)). Accordingly, self-insolated nanowire interconnect structures may be formed in both vertically and horizontally extending directions in properly configured protruding structures (more discussion will be provided with reference to FIGS. 7A and 7B). In some embodiments, the aspect ratio threshold value is about 1.

Moreover, in practice, due to the difference in crystal structures between the original material in the protruding structure and the subsequently generated oxide material, a profile of an outer surface thereof may become irregular (unlike that shown in the simplified illustrative diagrams of FIGS. 5A/B/C) and may expand laterally outward, as shown in FIGS. 6A-D (e.g., the outer profile shown in a lighter gray color indicates the oxide material of the dielectric layer). In some embodiments, a pitch distances (e.g., the gap between each pair of adjacent protruding structures) and cross-sectional profiles of the protruding structures are configured so that upon anodic oxidation treatment, the lateral expansion of an anodically formed dielectric layer becomes widest at an upper portion, forming an outwardly tapered structure. The outwardly tapered portion of the dielectric layer may generate a self-sealing effect at the top of the respective adjacently arranged protruding structures. In some embodiments, the outwardly tapered portions of the dielectric layer from a pair of adjacently arranged protruding structures may substantially seal off an opening that was originally defined there-between, thereby forming at least one low-k cavity extending substantially along and between the corresponding pair of the adjacent protruding structures (similar to the profile shown in FIG. 6D; however, to maintain clarity in the picture, only a portion of similar structural features are labeled).

The low-k cavity subsequently formed between each pair of adjacently arranged protruding structure may lead to a decreased overall equivalent k-value of the interconnect structure. Accordingly, in some embodiments where a low equivalent k-value is sought, a plurality of protruding structures (e.g., protruding structure 301) may be provided on a substrate, where at least a portion of the protruding structures are patterned adjacent to one another with a suitable gap width there-between. The pitch distances (i.e., gaps) there-between and the cross-sectional profiles thereof may be configured in such a way that, upon one or more anodic oxidation process, an upper portion of each of the protruding structure tapers outward and urges toward an upper portion of an adjacent protruding structure in a sealing manner, thereby defining at least one low-k cavity extending substantially along and between each pair of the adjacent protruding structures.

On the other hand, cavities between the protruding structures tend to weaken an overall structural integrity. Therefore, in some embodiments where higher mechanical strength is desired, the laterally tapered dielectric layer may be selectively removed (e.g, through suitable etching techniques) at a particular region (where extra mechanical strength is required) to enable access to a low-k cavity between a pair of corresponding protruding structures. Thus, one or more suitable dielectric material may be selectively disposed in at least a portion of the low-k cavity, thereby providing an increased mechanical strength at a selected region.

In some embodiments, upon anodic oxidation treatment, the mask disposed on a top portion of a corresponding protruding structure (as shown in FIG. 5C) may distort in shape and even become integrated as part of the dielectric layer that surrounds the nanowire interconnects in the protruding structure.

Referring again to FIG. 6D. It can be further observed that, due to a stress generated from the difference in crystal structures between the original material and the later formed oxide material, the anodic oxidation process may cause the formation of at least one nano-channel in the protruding structure. For instance, in some embodiments, at least one nano channel (e.g., the profile shown in white color between the vertically aligned nanowires in FIG. 6D) is generated, which extends substantially along a traversing path of the protruding structure in which it resides. Accordingly, the nano-channel may substantially extend along the direction of the corresponding nanowire interconnect in the protruding structure (and substantially vertically aligned there-to). In some embodiments, the stress-induced nano-channel is generated substantially within the protruding structure, and therefore may be substantially vacuum. The nano-channel generated within the protruding structure may further lower the overall equivalent k-value of the interconnect structure.

Figure 7A:
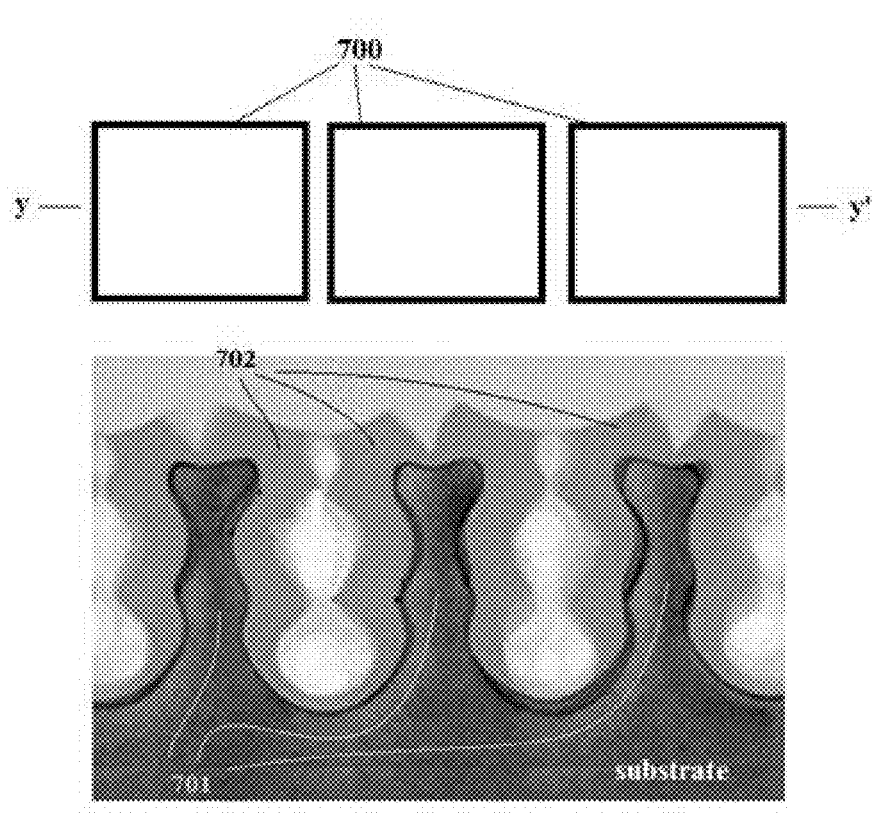
FIG. 7A illustrates an overhead profile configuration and a corresponding cross-sectional profile in accordance with one embodiment of the instant disclosure.

FIG. 7A illustrates an overhead profile configuration and a corresponding cross-sectional profile in accordance with one embodiment of the instant disclosure. Specifically, FIG. 7A shows an array of three vertical type protruding structures (e.g., structure 700), each of which may generate an associated vertically extending nanowire (e.g., vertical nanowires 701) embedded in a dielectric outer structure (e.g., dielectric layer 702) upon anodic oxidation treatment, when viewed along the cross-sectional line x-x'.

As discussed previously, the formation of conductive nanowire(s) in the protruding structure correlates to factors such as duration of oxidation and/or corresponding cross-sectional profile configuration. Generally, wider structural profiles (e.g., with lower aspect ratios in both the x and y directions) may facilitate the formation of vertically extending nanowires that are in electrical connection with the substrate, as the growth of oxide materials at the bottom portion of the protruding structure may not extend farther enough to fully replace the bottom part of the original conductive material (e.g., FIGS. 6A-6C). Accordingly, a protruding structure may be considered a vertical type (e.g., protruding structure 700) if an aspect ratio (e.g., vertical to lateral ratio) thereof is less than a threshold value in all-planar directions (e.g., the lateral width in all planar directions being greater than the height thereof). In some embodiments, the threshold value is 1.

Figure 7B:
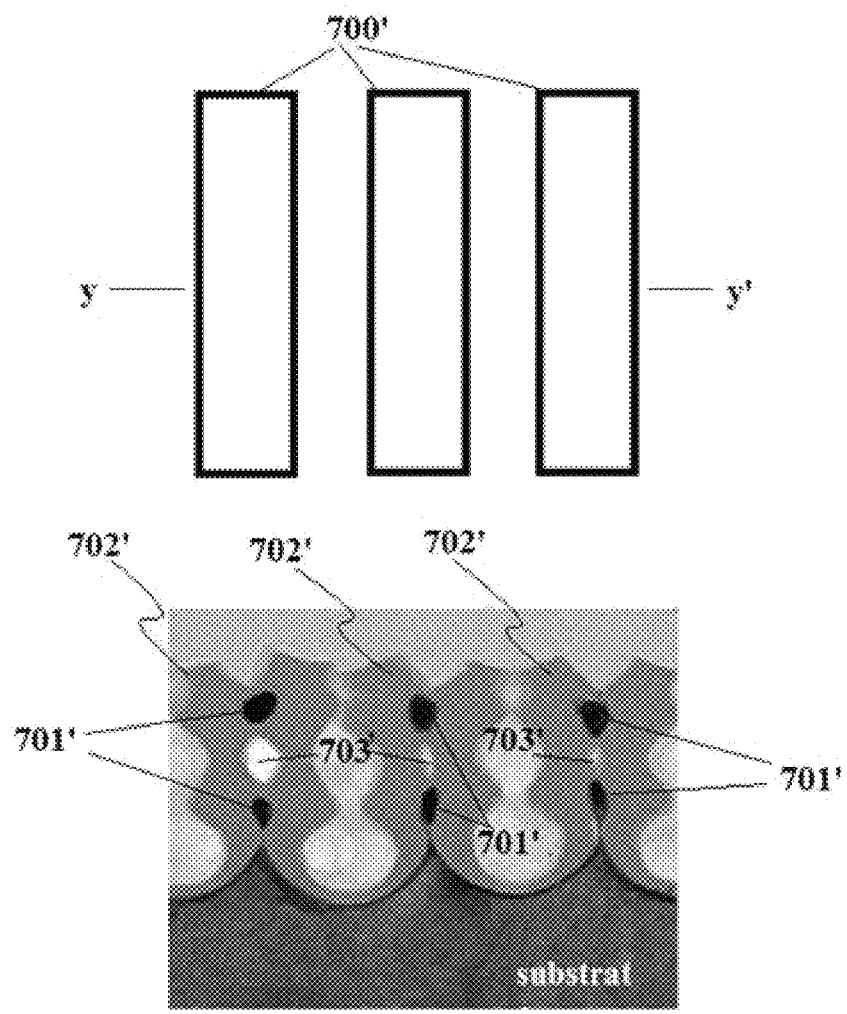
FIG. 7B illustrates an overhead profile configuration and a corresponding cross-sectional profile in accordance with another embodiment of the instant disclosure.

FIG. 7B illustrates an overhead profile configuration and a corresponding cross-sectional profile in accordance with another embodiment of the instant disclosure. Similarly, FIG. 7B shows an array of three horizontal type protruding structures (e.g., structure 700'), each of which may generate one or more associated horizontally extending nanowire (e.g., horizontal nanowires 701') embedded in a dielectric outer structure (e.g., dielectric layer 702') upon anodic oxidation treatment, when viewed along the cross-sectional line x-x'. In the instant example, each protruding structure comprises a pair of substantially vertically aligned nanowires therein. In addition, a nano-channel 703' is generated between the nanowires in each of the corresponding protruding structures.

As discussed previously, the formation of conductive nanowire(s) in the protruding structure correlates to factors such as duration of oxidation and/or corresponding cross-sectional profile configuration. Likewise, narrower structural profiles (e.g., with a higher aspect ratio in either one of the x and y directions) may facilitate the formation of horizontally extending nanowires that are electrically insulated from the substrate (e.g., FIG. 6D). Accordingly, a protruding structure may be considered a horizontal type (e.g., protruding structure 700') if an aspect ratio (e.g., vertical to lateral ratio) thereof is greater than a threshold value in at least one planar direction (e.g., a lateral width in at least one planar directions being smaller than the height thereof). In some embodiments, the threshold value is 1.

Figure 8A:
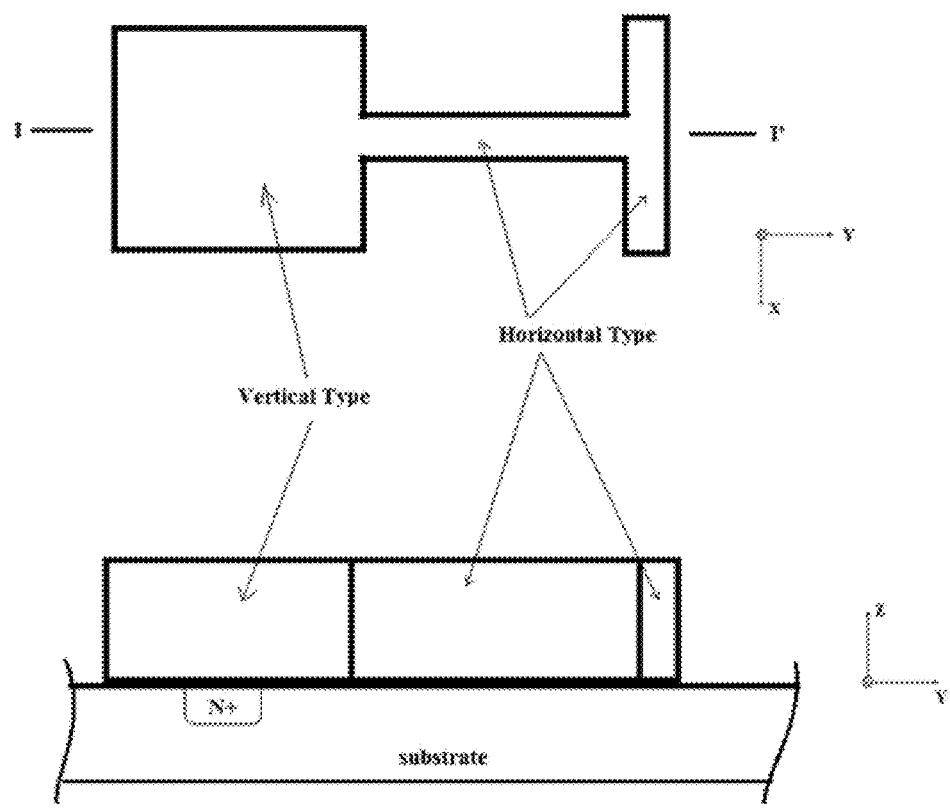
FIG. 8A illustrates a top view and a side view of an interconnect structure that comprises a combination of structural types, in accordance with one embodiment of the instant disclosure.
Figure 8B:
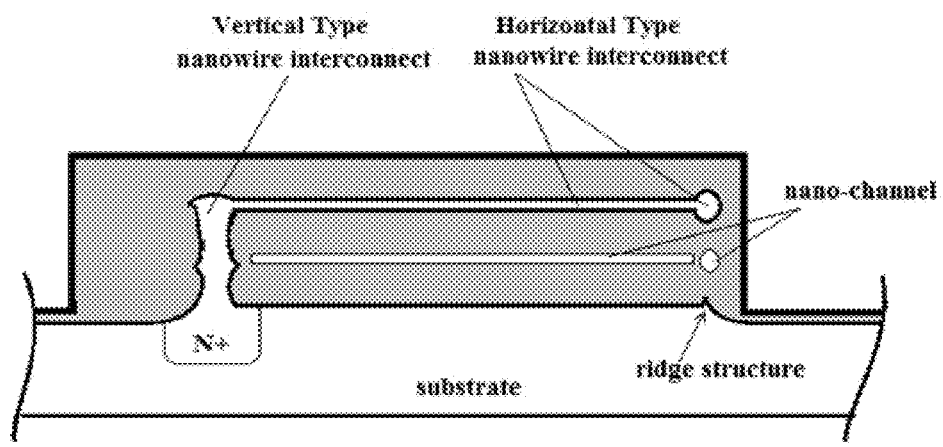
FIG. 8B illustrates a cross-sectional side view of the structure shown in FIG. 8A along the line I-I'.
Figure 8C:
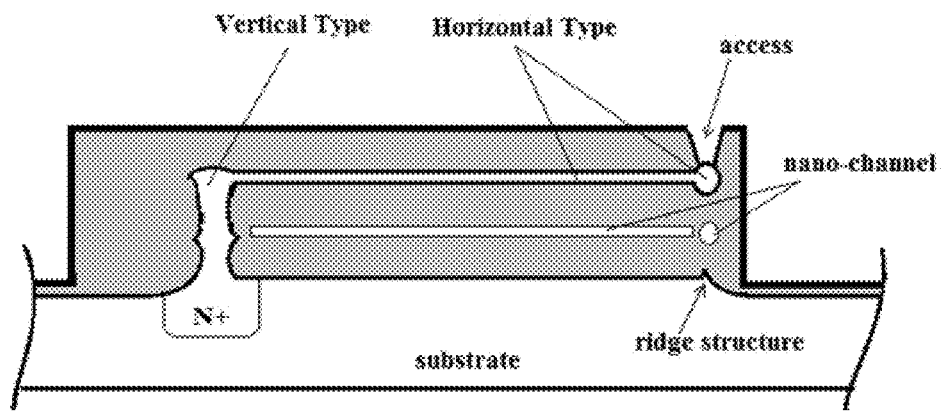
FIG. 8C illustrates a cross-sectional side view of the structure shown in FIG. 8A along the line I-I' with an additional feature.

The vertical type and the horizontal type protruding structures may be utilized cooperatively in combination to create a variety of interconnect structures suitable for different applications. Referring to FIGS. 8A, 8B, and 8C. FIG. 8A illustrates a top view and a side view of an interconnect structure that comprises a combination of structural types, in accordance with one embodiment of the instant disclosure. FIG. 8B illustrates a cross-sectional side view of the structure shown in FIG. 8A along the line I-I'. FIG. 8C illustrates a cross-sectional side view of the structure shown in FIG. 8A along the line I-I' with an additional feature.

As shown in FIG. 8A, a combined structure comprising one vertical type protruding structure and two horizontal type protruding structures are employed on a substrate. Moreover, the vertical type protruding structure is arranged on a negatively doped region of the substrate (e.g., the N+ region). A first one of the horizontal type protruding structures immediately connects the vertical type protruding structure, and extends horizontally along the y-axis. A second one of the horizontal type protruding structures extends horizontally along the x-axis, and intercepts the first horizontal type protruding structure.

As shown in FIG. 8B, upon anodic oxidation treatment, conductive nanowires of different types may be formed within the combination of protruding structures in fashions previously discussed. Specifically, the vertical type protruding structure, which possesses an aspect ratio below a threshold value in all planar directions, may yield a vertically extending nanowire in connection with the substrate. In the instant example, the vertically extending nanowire is in electrical connection with the N+ region of the substrate. Likewise, the horizontal type protruding structures, which possess an aspect ratio above a threshold value in at least one planar direction (e.g., in the y and the x directions, respectively), may yield horizontal nanowires that extend along the y-axis and the x-axis, respectively. Accordingly, with proper pattern arrangements, the interconnect structure in accordance with the instant disclosure may liberally establish electrical connections between different locations on a substrate.

In addition, nano-channels that extend substantially along the nanowire interconnects may be formed in the protruding structures during the anodic oxidation process (as shown in FIG. 8B) in fashions previously discussed. The nano-channels act as voids in the interconnect structure, and contribute to the lowering of overall k-value of the interconnect structure.

As shown in FIG. 8C, access points (such as vias) may be created at suitable locations of the interconnect structure to enable electrical connection to the nanowire interconnect embedded therein. For instance, suitable etching techniques may be utilized to selectively remove oxide materials surrounding the nanowire interconnect in the protruding structure, thereby creating an electrical access thereto at a desired location.

Figure 9A:
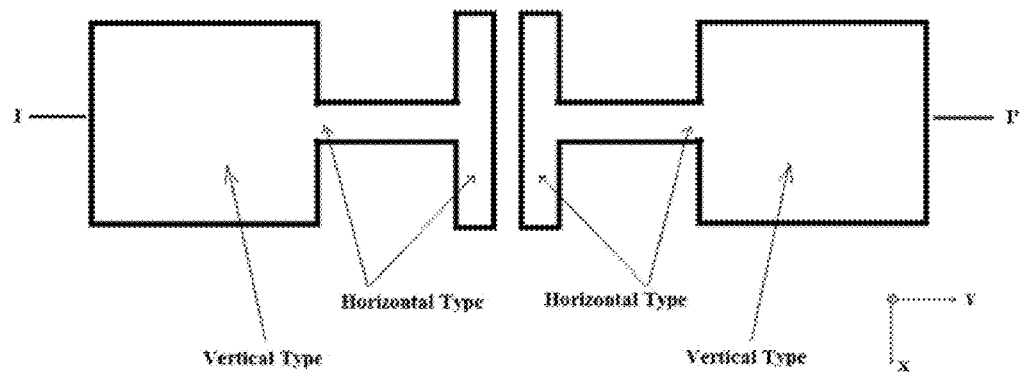
FIG. 9A illustrates a top view of an interconnect structure that comprises a combination of structural types, in accordance with one embodiment of the instant disclosure.
Figure 9B:
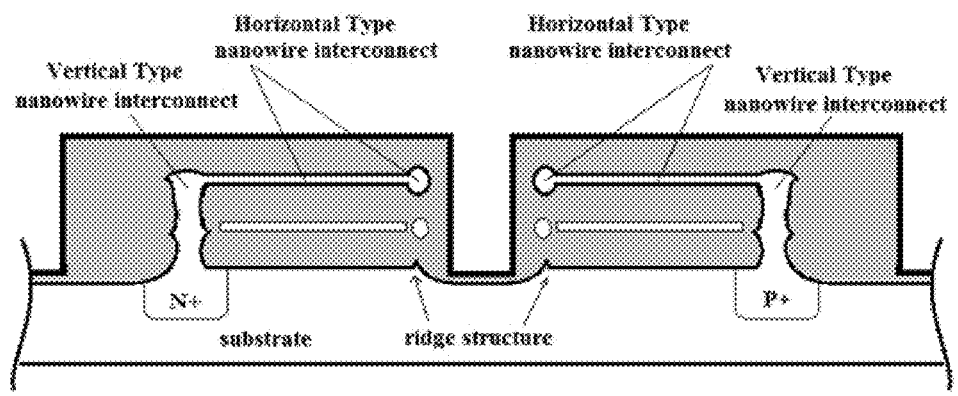
FIG. 9B illustrates a cross-sectional side view of the structure shown in FIG. 9A along the line I-I'.
Figure 9C:
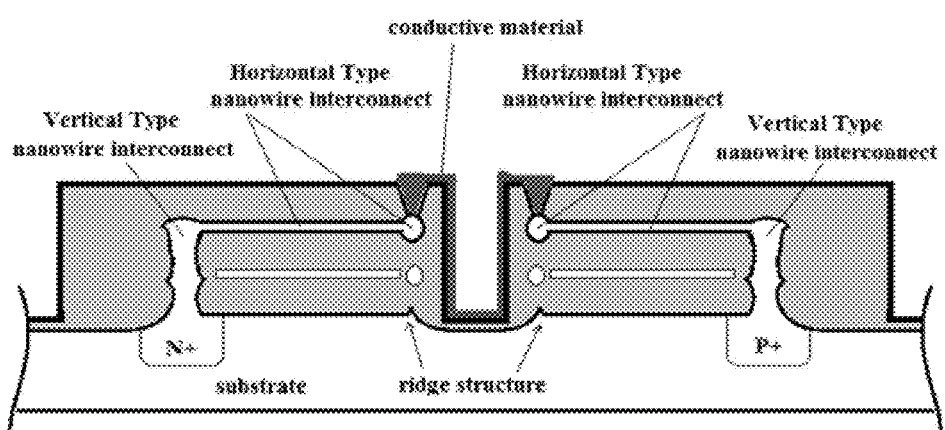
FIG. 9C illustrates a cross-sectional side view of the structure shown in FIG. 9A along the line I-I' with an additional feature.

Referring to FIGS. 9A, 9B, and 9C. FIG. 9A illustrates a top view of an interconnect structure that comprises a combination of structural types, in accordance with one embodiment of the instant disclosure. FIG. 9B illustrates a cross-sectional side view of the structure shown in FIG. 9A along the line I-I'. FIG. 9C illustrates a cross-sectional side view of the structure shown in FIG. 9A along the line I-I' with an additional feature.

FIG. 9A shows an exemplary arrangement that utilizes a slightly more complex combination of protruding structures of different types. Specifically, a pair of combined structures similar to that shown in FIG. 8A are provided in a substantially mirroring configuration. The vertical type protruding structure on the left hand side is arranged on a negatively doped region of the substrate (e.g., the N+ region), while the vertical type protruding structure on the right hand side is arranged on a positively doped region of the substrate (e.g., the P+ region). The remaining setups of the instant embodiment substantially resemble that of the previous example, and therefore will not be discussed in repetition.

As shown in FIG. 9B, upon anodic oxidation treatment, conductive nanowires of different types may be formed within the combination of protruding structures in fashions previously discussed. Specifically, the horizontal type nanowire interconnects from both the left and the right hand side structures extend toward each other (e.g., toward the center of the figure). The vertically type nanowire interconnect on the left hand side is in electrical connection with the N+ region on the substrate, while the one on the right hand side is in electrical connection with the P+ region thereof.

As shown in FIG. 9C, electrical access points are created on the respective interconnect structures at locations close to each other (proximate a central region there-between). One or more suitable conductive material is subsequently disposed between the interconnect structures to enable electrical connection from the N+ region to the P+ region of the substrate.

With the self-ending anodization technology in accordance with the instant disclosure, a conducting layer and a dielectric layer of an interconnect structure may be formed concurrently in a simple process. Moreover, owing to the formation of the low-k cavities and the substantially vacuum-sealed nano-channels in the interconnect structure, the overall equivalent dielectric constant thereof may be significantly reduced. Furthermore, a low temperature, cost effective, and environmentally friendly (as the anodic oxidation process only requires the use of de-ionized water as electrolyte) batch process may be provided in accordance with embodiments of the instant disclosure to meet the need of future low-k applications.

Accordingly, one aspect of the instant disclosure provides a method of forming an interconnect structure, which comprises: providing at least one protruding structure on a substrate traversing between a first connection region to a second connection region defined thereon; performing anodic oxidation on the substrate having the protruding structure; forming one or more nanowire interconnect in the protruding structure traversing between the first connection region and the second connection region; the nanowire interconnect being surrounded by a dielectric layer formed during the anodic oxidation.

Accordingly, another aspect of the instant disclosure provides a low-k self-insulating interconnect structure, which comprises: at least one protruding structure arranged on a substrate traversing between a first and a second connection regions defined thereon; at least one nanowire interconnect formed in the protruding structure, traversing between the first connection region and the second connection region; and a ridge structure formed under a lower portion of the protruding structure, having at least a section thereof extending substantially along the traversing direction of the nanowire interconnect.

Accordingly, another aspect of the instant disclosure provides a method of forming a self-insulating low-k interconnect structure, which comprises: providing a plurality of protruding structures on a substrate, at least one of the protruding structures traversing between a first connection region and a second connection region on a substrate, where at least a portion of the protruding structures are patterned adjacent to one another with a corresponding gap define there-between; performing anodic oxidation on the substrate having the plurality of protruding structures; and forming one or more nanowire interconnect in a protruding structure traversing between the first connection region and the second connection region, the nanowire interconnect being surrounded by a dielectric layer formed during the anodic oxidation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure, comprising:
    forming a protruding structure on a substrate traversing between a first connection region and a second connection region defined in the substrate, wherein the protruding structure is formed of a single material or a single compound material; and
    oxidizing the protruding structure, wherein the oxidizing of the protruding structure forms a nanowire interconnect inside the protruding structure, the protruding structure being oxidized by performing a self-ending anodic oxidation on the substrate having the protruding structure,
    the nanowire interconnect (i) being substantially surrounded by a dielectric layer formed by the anodic oxidation, the forming of the dielectric layer reaching a termination point without external interference, and (ii) traversing between the first connection region and the second connection region.

2. The method of claim 1,
    wherein the provision of the protruding structure comprises forming a vertical type protruding structure,
    wherein the vertical type protruding structure comprises an aspect ratio less than a threshold value in all in-plane directions.

3. The method of claim 1,
    wherein the provision of the protruding structure comprises forming a horizontal type protruding structure,
    wherein the horizontal type protruding structure comprises an aspect ratio greater than a threshold value in at least one in-plane direction.

4. The method of claim 1,
    wherein the anodic oxidation of the protruding structure forms at least a nano channel in the protruding structure, extending substantially along the traversing direction of the nanowire interconnect.

5. The method of claim 4,
wherein the nano channel comprises air.

6. The method of claim 1,
wherein the anodic oxidation of the protruding structure forms a ridge structure under a lower portion thereof, extending substantially along the traversing direction of the nanowire interconnect.

7. The method of claim 1,
wherein a transverse cross-sectional profile of the protruding structure is arranged so that a lower portion thereof in connection with the substrate substantially oxidizes before an upper portion thereof.

8. The method of claim 1, further comprising:
providing a mask layer on a surface of an upper portion of the protruding structure, the mask layer reducing an exposure of the upper portion in the anodic oxidation process, thereby reducing an oxidizing rate at the upper portion of the protruding structure.

9. The method of claim 1,
wherein the transverse cross-sectional profile of the protruding structure comprises at least one pair of local expansion and local contraction profiles, wherein the local contraction profile is arranged closer to the substrate than the local expansion profile.

10. The method of claim 1, wherein the performing of the anodic oxidation on the substrate comprises:
using the substrate as part of an anode electrode.

11. The method of claim 1, wherein the nanowire interconnect comprises a portion of the protruding structure.

12. A method of forming an interconnect structure, comprising:
forming a plurality of protruding structures on a substrate, the protruding structures traversing between a first connection region and a second connection region in the substrate, wherein each of the protruding structures is formed of a single material or a single compound material,
wherein the protruding structures are patterned adjacent to one another with a corresponding gap defined there-between; and
oxidizing a protruding structure of the plurality of protruding structures, wherein the oxidizing of the protruding structure forms a nanowire interconnect inside the protruding structure, the protruding structure being oxidized by performing a self-ending anodic oxidation on the substrate having the protruding structures,
the nanowire interconnect (i) being surrounded by a dielectric layer formed by the anodic oxidation, the forming of the dielectric layer reaching a termination point without external interference, and (ii) traversing between the first connection region and the second connection region.

13. The method of claim 12,
wherein the anodic oxidation causes an upper portion of each of the protruding structures to expand laterally outward toward an upper portion of an adjacent protruding structure, thereby defining at least one cavity having a low-K dielectric constant extending substantially along and between each pair of the adjacent protruding structures.

14. The method of 13, further comprising:
selectively filling at least a portion of the at least one cavity with dielectric material.

15. The method of claim 12, wherein the performing of the anodic oxidation on the substrate comprises:
using the substrate as part of an anode electrode.

16. The method of claim 12, wherein the nanowire interconnect comprises a portion of the protruding structure of the plurality of protruding structures.

17. A method of forming an interconnect structure, comprising:
forming a protruding structure on a substrate traversing between a first connection region and a second connection region defined in the substrate, wherein the protruding structure is formed of a single material or a single compound material; and
oxidizing the protruding structure, wherein the oxidizing of the protruding structure forms a nanowire interconnect inside the protruding structure, the protruding structure being oxidized by performing a self-ending anodic oxidation on the substrate having the protruding structure,
the nanowire interconnect (i) being substantially surrounded by a dielectric layer formed by the anodic oxidation, the forming of the dielectric layer reaching a termination point without external interference, and (ii) traversing between the first connection region and the second connection region,
wherein the anodic oxidation of the protruding structure forms at least a substantially vacuum nano channel in the protruding structure, extending substantially along the traversing direction of the nanowire interconnect.

18. The method of claim 17,
wherein the provision of the protruding structure comprises forming a vertical type protruding structure,
wherein the vertical type protruding structure comprises an aspect ratio less than a threshold value in all in-plane directions.

19. The method of claim 17,
wherein the provision of the protruding structure comprises forming a horizontal type protruding structure,
wherein the horizontal type protruding structure comprises an aspect ratio greater than a threshold value in at least one in-plane direction.

20. The method of claim 17,
wherein the anodic oxidation of the protruding structure forms a ridge structure under a lower portion thereof, extending substantially along the traversing direction of the nanowire interconnect.

21. The method of claim 17,
wherein a transverse cross-sectional profile of the protruding structure is arranged so that a lower portion thereof in connection with the substrate substantially oxidizes before an upper portion thereof.

22. The method of claim 17, further comprising:
providing a mask layer on a surface of an upper portion of the protruding structure, the mask layer reducing an exposure of the upper portion in the anodic oxidation process, thereby reducing an oxidizing rate at the upper portion of the protruding structure.

23. The method of claim 17, wherein the performing of the anodic oxidation on the substrate comprises:
using the substrate as part of an anode electrode.

24. The method of claim 17, wherein the nanowire interconnect comprises a portion of the protruding structure.

25. A method of forming an interconnect structure, comprising:
forming a plurality of protruding structures on a substrate, the protruding structures traversing between a first connection region and a second connection region in the substrate, each of the protruding structures being formed of a single material or a single compound material, the protruding structures being patterned adjacent to one another with a corresponding gap defined there-between;

oxidizing a protruding structure of the plurality of protruding structures, the oxidizing of the protruding structure forming a nanowire interconnect inside the protruding structure, the protruding structure being oxidized by performing a self-ending anodic oxidation on the substrate having the protruding structures, the anodic oxidation causing an upper portion of each of the protruding structures to expand laterally outward toward an upper portion of an adjacent protruding structure, thereby defining at least one cavity having a low-K dielectric constant extending substantially along and between each pair of the adjacent protruding structures, the nanowire interconnect (i) being surrounded by a dielectric layer formed during the anodic oxidation, and (ii) traversing between the first connection region and the second connection region; and selectively filling at least a portion of the at least one cavity with dielectric material.

* * * * *